United States Patent
Lee et al.

(10) Patent No.: US 8,003,424 B2
(45) Date of Patent: Aug. 23, 2011

(54) METHOD FOR FABRICATING CMOS IMAGE SENSOR WITH POCKET PHOTODIODE FOR MINIMIZNG IMAGE LAG

(75) Inventors: Kyung-Ho Lee, Suwon-si (KR); Yi-Tae Kim, Hwaseong-si (KR); Jung-Chak Ahn, Yongin-si (KR); Sae-Young Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 227 days.

(21) Appl. No.: 11/983,913

(22) Filed: Nov. 13, 2007

(65) Prior Publication Data

US 2008/0179642 A1 Jul. 31, 2008

(30) Foreign Application Priority Data

Jan. 30, 2007 (KR) .................. 10-2007-0009310

(51) Int. Cl.
*H01L 21/00* (2006.01)
(52) U.S. Cl. ......... 438/60; 438/433; 438/447; 438/424; 257/292; 257/E27.131; 257/E27.132; 257/E27.133; 257/E31.038
(58) Field of Classification Search .................. 257/292, 257/457, 458, E33.076, E33.077, E27.131, 257/E27.132, E27.133, E31.038; 438/301, 438/510, 60, 433, 447, 424
See application file for complete search history.

(56) References Cited

U.S. PATENT DOCUMENTS

| | | | |
|---|---|---|---|
| 5,514,887 A * | 5/1996 | Hokari | 257/222 |
| 7,358,108 B2 * | 4/2008 | Han et al. | 438/60 |
| 2004/0241950 A1 * | 12/2004 | Olofsson | 438/301 |
| 2005/0280046 A1 * | 12/2005 | Shin | 257/226 |
| 2005/0280054 A1 | 12/2005 | Park et al. | |
| 2005/0285165 A1 * | 12/2005 | Ohkawa et al. | 257/292 |
| 2006/0084195 A1 * | 4/2006 | Lyu | 438/48 |
| 2006/0138492 A1 | 6/2006 | Shim et al. | |
| 2007/0207599 A1 * | 9/2007 | Shin | 438/510 |

OTHER PUBLICATIONS

Korean Patent Application No. 1020020042661 to Lim, having Publication date of Jan. 31, 2004 (w/ English Abstract page).
Korean Patent Application No. 1020040089255 to Park et al., having Publication date of May 10, 2006 (w/ English Abstract page).
Korean Patent Application No. 1020040114781 to Shim et al., having Publication date of Jul. 4, 2006 (w/ English Abstract page).

* cited by examiner

*Primary Examiner* — Matthew Smith
*Assistant Examiner* — Wilner Jean Baptiste
(74) *Attorney, Agent, or Firm* — Monica H. Choi

(57) ABSTRACT

A CMOS image sensor includes a photosensitive device, a floating diffusion region, a transfer transistor, and a pocket photodiode formed in a semiconductor substrate of a first conductivity type. The floating diffusion region is of a second conductivity type. The transfer transistor has a channel region disposed between the photosensitive device and the floating diffusion region. The pocket photodiode is of the second conductivity type and is formed under a first portion of a bottom surface of the channel region such that a second portion of the bottom surface of the channel region abuts the semiconductor substrate.

18 Claims, 11 Drawing Sheets

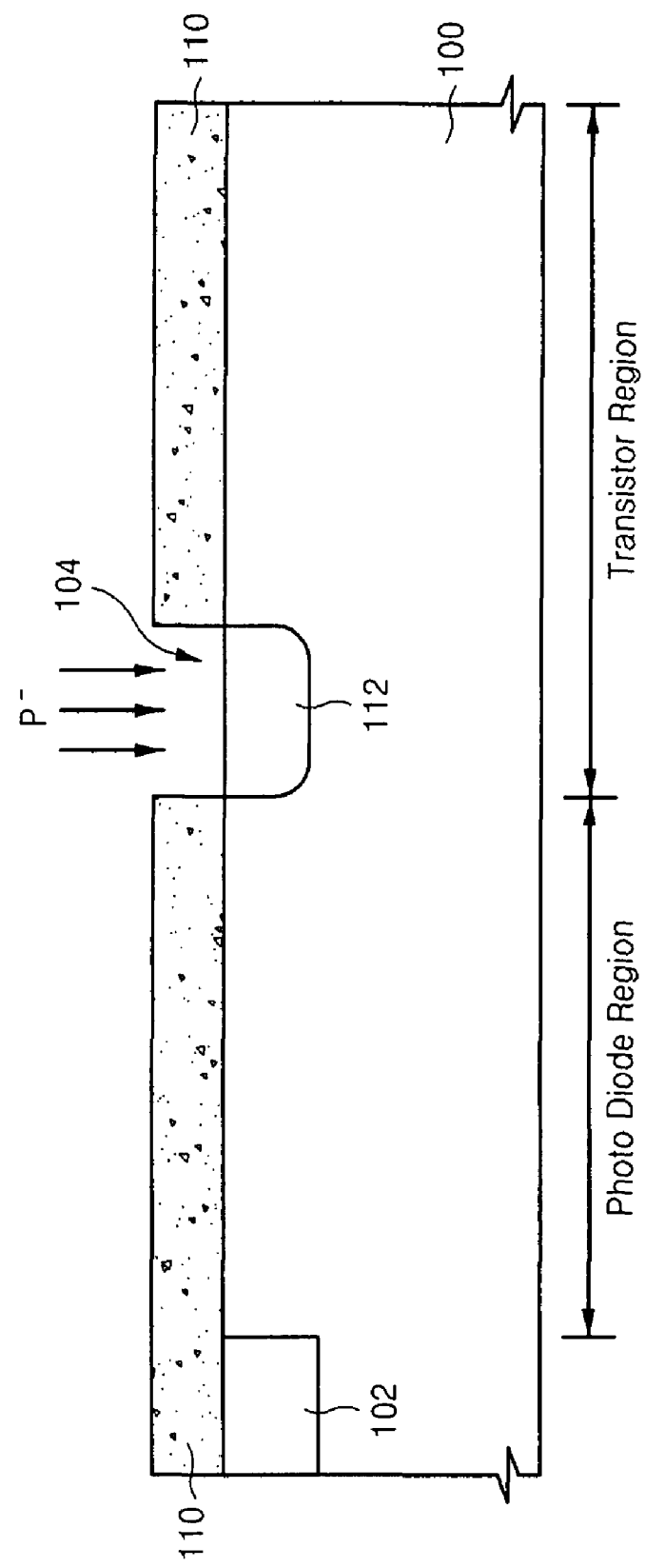

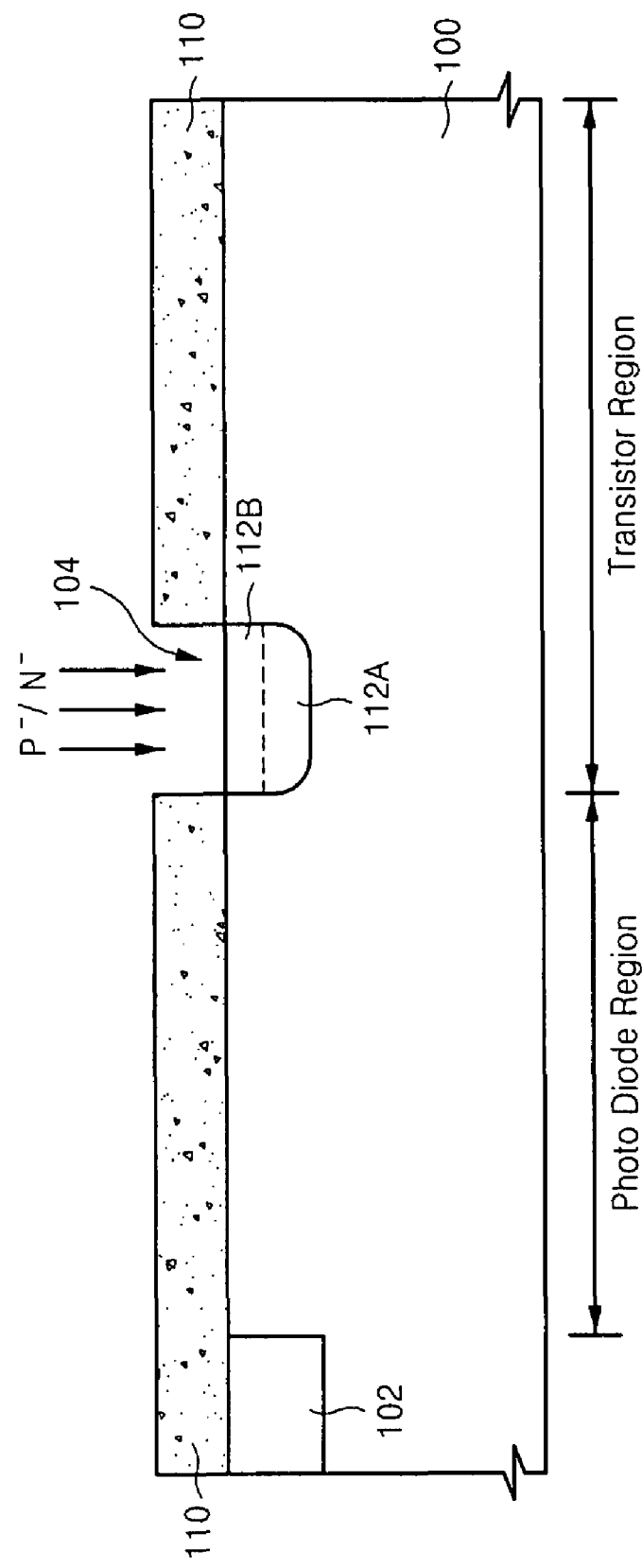

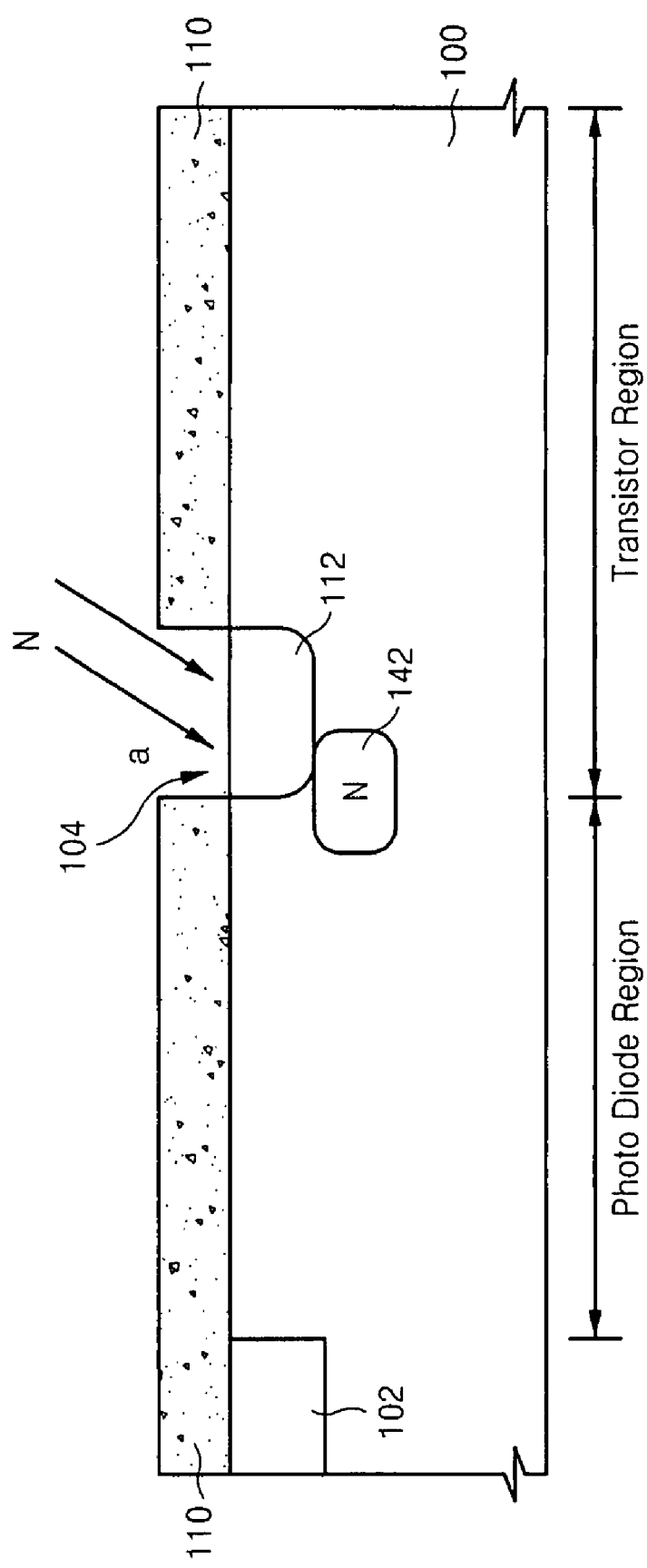

METHOD FOR FABRICATING CMOS IMAGE SENSOR WITH POCKET PHOTODIODE FOR MINIMIZNG IMAGE LAG

This application claims priority under 35 USC §119 to Korean Patent Application No. 2007-09310, filed on Jan. 30, 2007 in the Korean Intellectual Property Office, the disclosure of which is incorporated herein in its entirety by reference.

BACKGROUND OF THE INVENTION

1. Field of the Invention

The present invention relates generally to image sensors, and more particularly, to a CMOS (complementary metal oxide semiconductor) image sensor with a main photodiode having a diffusion layer thereon for minimizing dark current and with a pocket photodiode for minimizing image lag.

2. Background of the Invention

An image sensor is a semiconductor device that converts an image into electrical signals. An image sensor may be a charge coupled device (CCD) or a complementary metal oxide semiconductor (CMOS) image sensor (CIS). A unit pixel of a CMOS image sensor includes a transfer transistor that transmits charge generated by a photo sensitive device (PSD) to a floating diffusion region.

However, the CMOS image sensor has dark current generated therein from charge traps at dangling bonds of a hetero-interface such as an interface between a silicon substrate and a silicon oxide layer. As is well known, such dangling bonds are positioned between a valence band and a conduction band in an energy band and thus capture and shift electrons to the conduction band regardless of reception of light. Such shifted electrons are accumulated at the PSD even when an image is not captured, and consequently a color spot or a white spot appears on a screen.

In addition, when the transfer transistor transitions from being turned on to being turned off, a reverse electric field is formed between the transfer transistor and the PSD. Such reverse electric field causes a feed through effect in which some of the electrons flowing across the transfer transistor flow backward to the PSD. The feed through phenomenon causes an image lag with a ghost appearing on a reproduced image.

The dark current may be traded-off for the image lag in a CMOS image sensor. Therefore, a CMOS image sensor with minimized dark current and image lag is desired.

SUMMARY OF THE INVENTION

Accordingly, a CMOS (complementary metal oxide semiconductor) image sensor is fabricated with a pocket photodiode for minimizing image lag and with a diffusion layer over a main photodiode for minimizing dark current.

An image sensor such as a CMOS (complementary metal oxide semiconductor) image sensor according to an aspect of the present invention includes a photosensitive device, a floating diffusion region, a transfer transistor, and a pocket photodiode. The photosensitive device is formed in a semiconductor substrate of a first conductivity type. The floating diffusion region is of a second conductivity type. The transfer transistor has a channel region disposed between the photosensitive device and the floating diffusion region. The pocket photodiode is of the second conductivity type and is formed under a first portion of a bottom surface of the channel region such that a second portion of the bottom surface of the channel region abuts the semiconductor substrate.

In an example embodiment of the present invention, the photosensitive device includes a main photodiode of the second conductivity type and a diffusion layer of the first conductivity type disposed on the main photodiode for minimizing dark current.

In another embodiment of the present invention, the pocket photodiode abuts the first portion of the bottom surface of the channel region, the main photodiode, and the semiconductor substrate. In addition, the channel region abuts the main photodiode, the diffusion layer, the pocket photodiode, the floating diffusion region, and the semiconductor substrate.

In a further embodiment of the present invention, the transfer transistor further includes a gate dielectric and a transfer gate disposed above the channel region. In addition, the image sensor also includes a reset transistor having a reset gate dielectric, a reset gate, a drain region, and the floating diffusion region as a source.

In another embodiment of the present invention, the channel region of the transfer transistor is of the first conductivity type. Alternatively, the channel region is a stack of a plurality of regions with at least one region being of the first conductivity type and with at least one region being of the second conductivity type.

In one example embodiment of the present invention, the first conductivity type is N-type conductivity, and the second conductivity type is P-type conductivity. The present invention may be used to particular advantage when the image sensor is a CMOS (complementary metal oxide semiconductor) image sensor.

In another embodiment of the present invention, the channel region of the transfer transistor is formed by implanting a first dopant of the first conductivity type through an opening of an implantation mask over the semiconductor substrate. In addition, a second dopant of the second conductivity type is implanted through the opening with a tilt angle to form the pocket photodiode under the first portion of the bottom surface of the channel region such that the second portion of the bottom surface of the channel region abuts the semiconductor substrate.

In this manner, the pocket photodiode prevents electrons from flowing backward to the main photodiode from the floating diffusion region to minimize image lag. Furthermore, the diffusion layer on the main photodiode minimizes dark current.

BRIEF DESCRIPTION OF THE DRAWINGS

The above and other features and advantages of the present invention will become more apparent when described in detailed exemplary embodiments thereof with reference to the attached drawings in which:

FIGS. 4, 5A, 5B, 6, 7, 8, 9, and 10 are cross-sectional views during fabrication of the unit pixel of the CMOS image sensor in FIGS. 1, 2, and 3, according to embodiments of the present invention.

The figures referred to herein are drawn for clarity of illustration and are not necessarily drawn to scale. Elements having the same reference number in FIGS. 1, 2, 3, 4, 5A, 5B, 6, 7, 8, 9, and 10 refer to elements having similar structure and/or function.

DETAILED DESCRIPTION OF THE INVENTION

Figure 1:
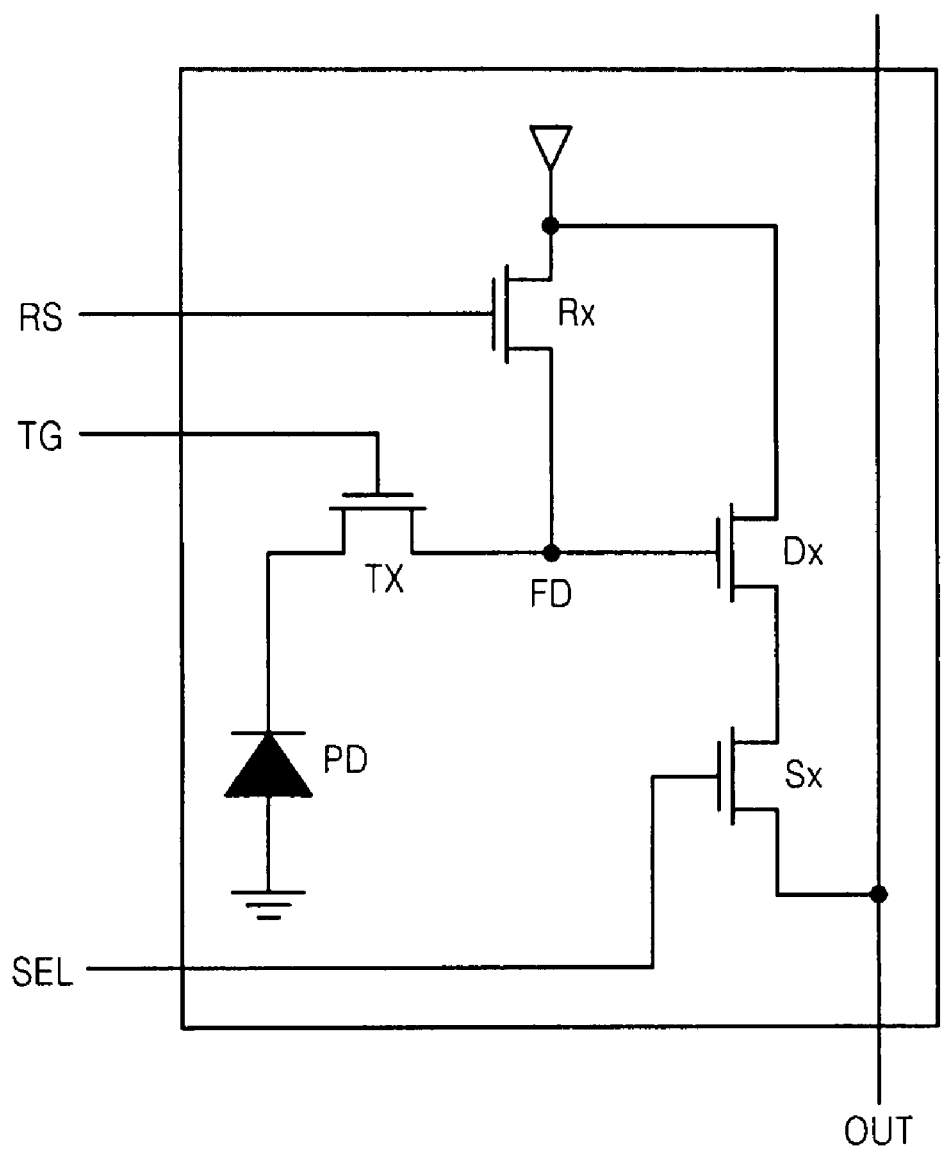
FIG. 1 is a circuit diagram of a unit pixel of a CMOS image sensor, according to an embodiment of the present invention.

The present invention is now described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a circuit diagram of a unit pixel of a CMOS (complementary metal oxide semiconductor) image sensor, according to an embodiment of the present invention. Referring to FIG. 1, the unit pixel includes a photo sensitive device (PSD) such as a photodiode PD that receives light to generate photo-charge. The present invention may also be practiced when the PSD is alternatively implemented as a photo transistor, a photo gate, a pinned photo diode (PPD) or a combination thereof.

In addition, the unit pixel of FIG. 1 also includes a transfer transistor Tx that transfers charge generated by the PD to a floating diffusion region FD, a reset transistor Rx that periodically resets the floating diffusion region FD, a drive transistor Dx configured as a source follower buffer amplifier for generating a signal corresponding to the amount of charge in the floating diffusion region FD, and a select transistor Sx that performs switching when the unit pixel is addressed. In FIG. 1, "RS" refers to a reset signal applied to a gate of the reset transistor Rx, and "TG" refers to a transfer signal applied to a gate of the transfer transistor Tx.

The unit pixel of FIG. 1 includes a single PD and four MOS transistors Tx, Rx, Dx, and Sx, but the present invention is not restricted thereto. For example, the present invention may be practiced for any unit pixel circuit having at least three transistors including a transfer transistor Tx and a source follower buffer amplifier Dx and a PD.

Figure 2:
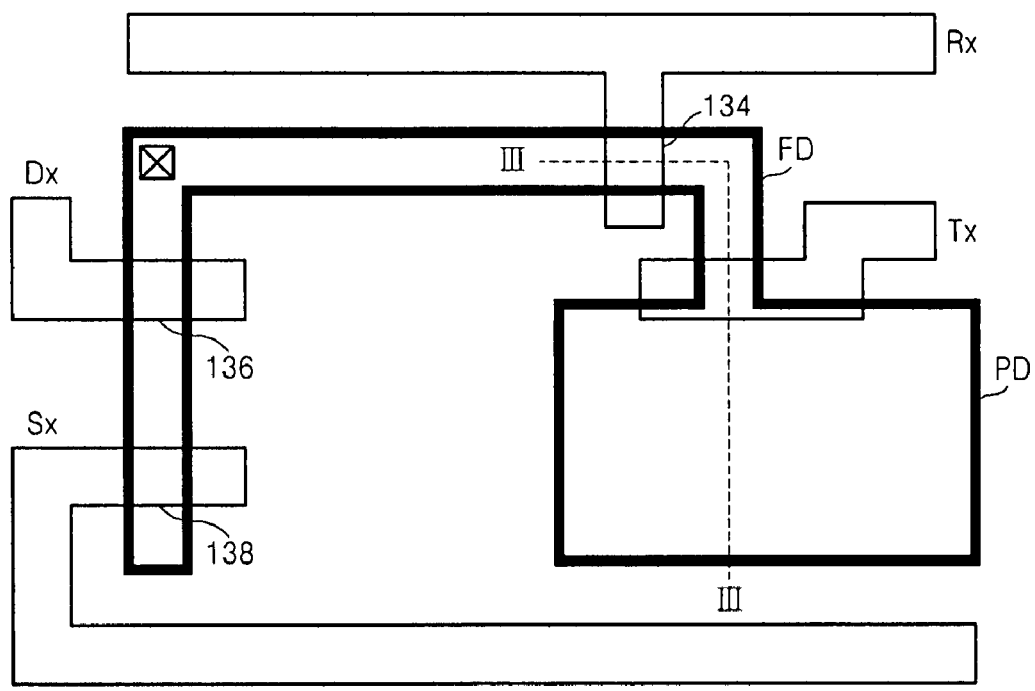
FIG. 2 is a layout of the unit pixel of FIG. 1, according to an embodiment of the present invention.
Figure 3:
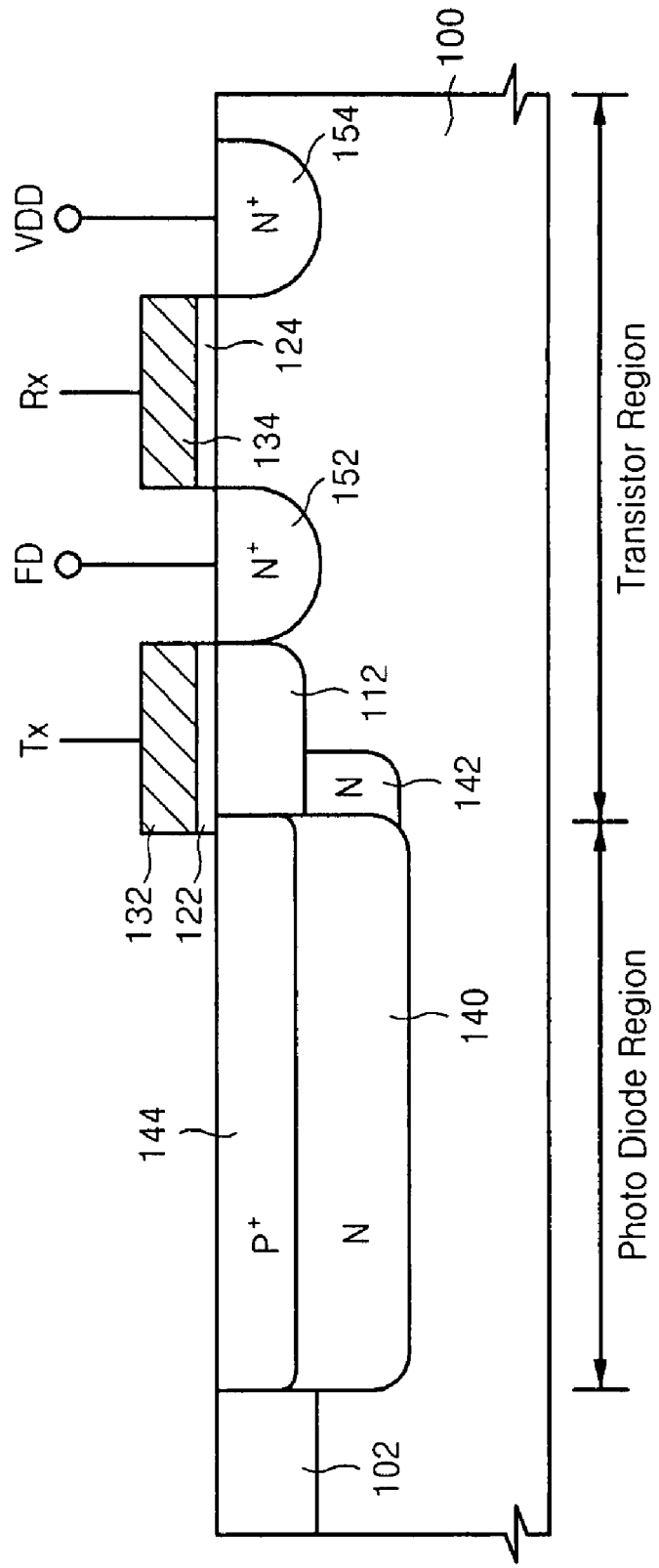
FIG. 3 is a cross-sectional view of the unit pixel taken along the lines III-III illustrated in FIG. 2, according to an embodiment of the present invention.

The CMOS image sensor of FIG. 1 is now described in more detail with reference to FIGS. 2 and 3. FIG. 2 illustrates a layout of the unit pixel of FIG. 1, according to an embodiment of the present invention. FIG. 3 is a cross-sectional view of the unit pixel taken along the line III-III in FIG. 2. Referring to FIG. 2, an active region is defined by bold solid lines, and a device isolation region (102 in FIG. 3) is formed outside the active region. The device isolation region 102 is formed using a shallow trench isolation (STI) process in FIG. 3, but the device isolation region 102 may be formed using a local oxidation of silicon (LOCOS) process.

Further referring to FIGS. 2 and 3, a gate 132 of a transfer transistor Tx, a gate 134 of a reset transistor Rx, a gate 136 of a drive transistor Dx, and a gate 138 of a select transistor Sx are formed over the active region. Referring to FIG. 3, the CMOS image sensor is formed with a semiconductor substrate 100 having a photo diode (PD) region and a transistor region. For example, the semiconductor substrate 100 may be comprised of silicon having a first conductivity type, (such as P-type conductivity for example).

In the photodiode region, a main photodiode (PD) 140 of a second conductivity type (such as N-type conductivity for example) is formed to generate and accumulate charges in response to incident light. The second conductivity of the main photodiode 140 is opposite of the first conductivity of the semiconductor substrate 100.

On the main photodiode 140, a $P^+$-type diffusion layer 144 is formed toward a surface of the semiconductor substrate 100. The diffusion layer 144 reduces dark current at the surface of the silicon substrate 100 having dangling bonds in the PD region. In other words, when electron-hole pairs are thermally generated at such dangling bonds, the holes are diffused to a grounded substrate via the diffusion layer 144, and the electrons recombine with the holes while being diffused to the diffusion layer 144 to become extinct. As a result, the thermally generated electrons are prevented from being accumulated at the main photodiode 140 such that dark current is minimized.

The transfer transistor Tx is disposed in the transistor region of the semiconductor substrate 100 to transfer charge generated by the main photodiode 140 to an $N^+$-type floating diffusion region 152.

A transfer gate dielectric 122 and a transfer gate 132 of the transfer transistor Tx are disposed on a channel region 112 of the transfer transistor Tx. The channel region 112 provides a passage for photocharge from the main photodiode 140 to the floating diffusion node 152. The channel region 112 is of $P^-$-type conductivity or has a stack of a plurality of regions with at least one region being of $P^-$-type conductivity and at least one region being of $N^-$-type conductivity.

Herein, a region referred to as $P^+$-type conductivity has a higher dopant concentration of a P-type dopant such as at least one order of magnitude for example than a region referred to as P⁻-type conductivity. Similarly, a region referred to as N⁺-type conductivity has a higher dopant concentration of an N-type dopant such as at least one order of magnitude for example than a region referred to as N⁻-type conductivity.

Abutting a first portion of a bottom surface of the channel region 112 is an N-type pocket photodiode 142 formed to be smaller in volume than the main photodiode 140. Thus, a second portion of the bottom surface of the channel region 112 abuts the semiconductor substrate 100. The pocket photodiode 142 aids in charge transfer between the main photodiode 140 and the channel region 112.

When the transfer transistor Tx changes from being turned on to being turned off, the pocket photodiode 142 prevents a feed through phenomenon in which charge desired to be flowing from the main photodiode 140 to the floating diffusion node 152 through the transfer transistor Tx flows backward to the main photodiode 140. Thus, with prevention of such feed through phenomenon, image lag is in turn prevented.

In addition, a reset transistor Rx is disposed near the transfer transistor Tx with the floating diffusion region 152 forming a source of the reset transistor Rx. A drain region 154 of N⁺-type conductivity is also formed for the reset transistor Rx in the semiconductor substrate 100. A reset gate dielectric 124 and a reset gate 134 are formed on a channel region between the N⁺-type conductivity regions 152 and 154.

Operation of the CMOS image sensor is now described. When external light is incident to the main photodiode 140, the main photodiode 140 generates an amount of charge that is proportional to the intensity of the sensed light. Such charge generated by the main photodiode 140 is confined in the main photodiode 140 due to a gate barrier of the transfer transistor Tx.

When the transfer transistor Tx is turned on while the reset transistor Rx is turned off, the charge accumulated at the main photodiode 140 is transferred to the floating diffusion region 152 having a higher potential. Thereafter, when the transfer transistor Tx is turned off, the main photodiode 140 remains in a depletion state. At this time, the pocket photodiode 142 positioned between the main photodiode 140 and the channel region 112 inhibits electrons from flowing backward to the main photodiode 140, thereby preventing image lag.

Next, during a predetermined accumulation time, electrons generated by light incident to the main photodiode 140 are accumulated at a depletion region of the main photodiode 140.

Thereafter, when the reset transistor Rx is turned on in response to the reset signal RS, the potential at the floating diffusion region 152 is reset to a VDD reset level with a gate potential barrier of the reset transistor Rx being lowered such that electrons stored in the floating diffusion region 152 are discharged. Thereafter, the reset transistor Rx is turned off with the gate potential barrier of the reset transistor Rx being restored to an original high state.

At this time, an output voltage OUT of the unit pixel is sampled to generate a reset signal from coupling the floating diffusion region 152 to the output OUT. Next when the transfer transistor Tx is turned, electrons that have been accumulated by the main photodiode 140 are transferred to the floating diffusion region 152 via the channel region 112 of the transfer transistor Tx. With such charge at the floating diffusion region 152, the output voltage OUT is sampled to generate an image signal from coupling the floating diffusion region 152 to the output OUT. For correlated double sampling, a final output of the unit pixel is determined from a difference between the reset signal and the image signal.

In one embodiment of the present invention, the channel region 112 is of P-type conductivity for forming a potential barrier between the N-type main photodiode 140 and the N⁺-type floating diffusion region 152. In addition, a low concentration of N-type impurity ions may also be implanted into the channel region 112 so that electrons are easily transferred from the N-type main photodiode 140 to the floating diffusion region 152 when a high clock signal is applied to the transfer gate 132. In addition, the channel region 112 may further include an N-type conductivity region below the P-type conductivity region for preventing a blooming effect and controlling a punch-through voltage.

Figure 4:
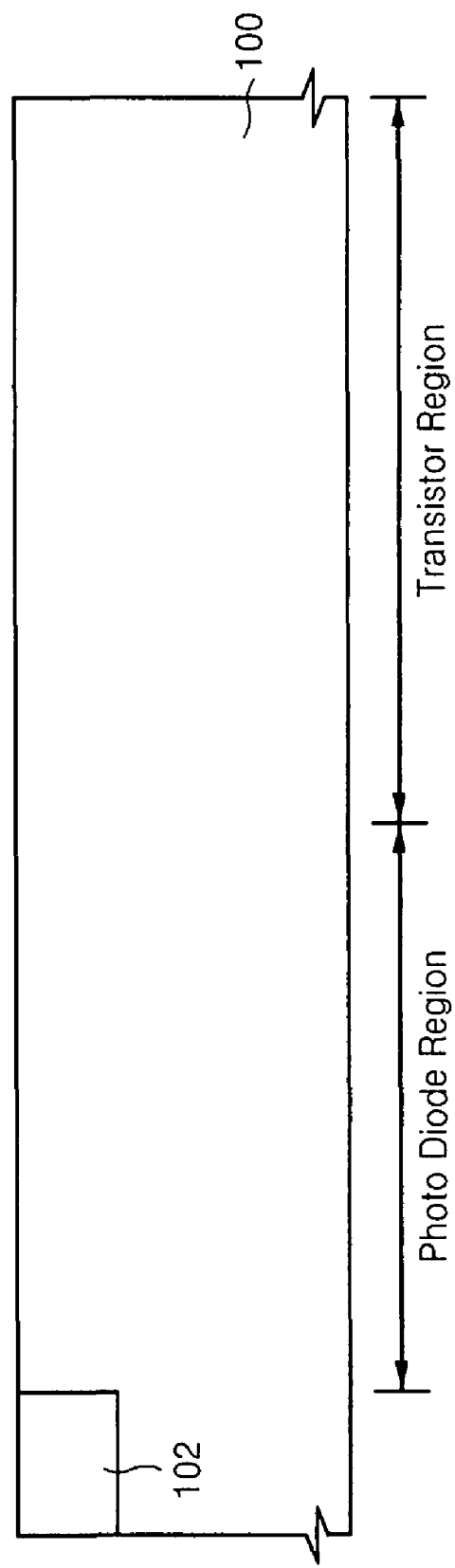

Steps for fabricating the unit pixel of FIG. 3 are now described in reference to FIGS. 4, 5A, 5B, 6, 7, 8, 9, and 10, according to embodiments of the present invention. Referring to FIG. 4, the device isolation region 102 is formed in the semiconductor substrate 100, using for example a STI (shallow trench isolation) process, for defining the active region in the semiconductor substrate 100. A LOCOS process may alternatively be used to form the device isolation region 102. Thereafter, a P-well (not shown) is formed with the semiconductor substrate 100 including the photodiode region and the transistor region.

Subsequently referring to FIG. 5A, a first implantation mask 110 is patterned to form an opening 104 therein over the semiconductor substrate 100. The opening 104 exposes a portion of the semiconductor substrate 100 for forming the channel region 112 of the transfer transistor Tx therein. To that end, a P-type dopant is implanted to the exposed region of the semiconductor substrate 100. The P-type dopant is implanted substantially perpendicular to the semiconductor substrate 100 to form the P-type channel region 112.

Referring to FIG. 5B, an N-type dopant may also be implanted through the opening 104 to form an N⁻-type region 112A under the P⁻-type region 112B with the stack of the P⁻-type region 112B and the N⁻-type region 112A forming the channel region 112 of the transfer transistor Tx. The order for implanting the P-type dopant for forming the region 112B and for implanting the N-type dopant for forming the region 112A is not restricted to a particular order. Note that the subsequent FIGS. 6, 7, 8, 9, and 10 illustrate the uniform channel region 112 formed in FIG. 5A. However, the present invention may also be practiced when the stack of regions 112A and 112B of FIG. 5B are formed instead in FIGS. 6, 7, 8, 9, and 10.

Subsequently referring to FIG. 6, the pocket photodiode 142 is formed still using the first implantation mask 110. In detail, an N-type dopant is implanted through the opening 104 into the semiconductor substrate 100 at a predetermined tilt angle in an "a" direction. With such a tilted implantation angle, the pocket photodiode 142 is formed toward a corner of the channel region 112. Thus, the pocket photodiode 142 abuts just a portion of the bottom surface of the channel region 112 with a remaining portion of the bottom surface of the channel region 112 abutting the semiconductor substrate 100.

The implantation tilt angle in FIG. 6 may be from about 7 degrees to about 10 degrees. The order for forming the channel region 112 and the pocket photodiode 142 is not particularly restricted. The pocket photodiode 142 is provided for efficient charge transfer through the transfer transistor Tx and to inhibit the feed through phenomenon for preventing image lag as already described herein.

Figure 7:
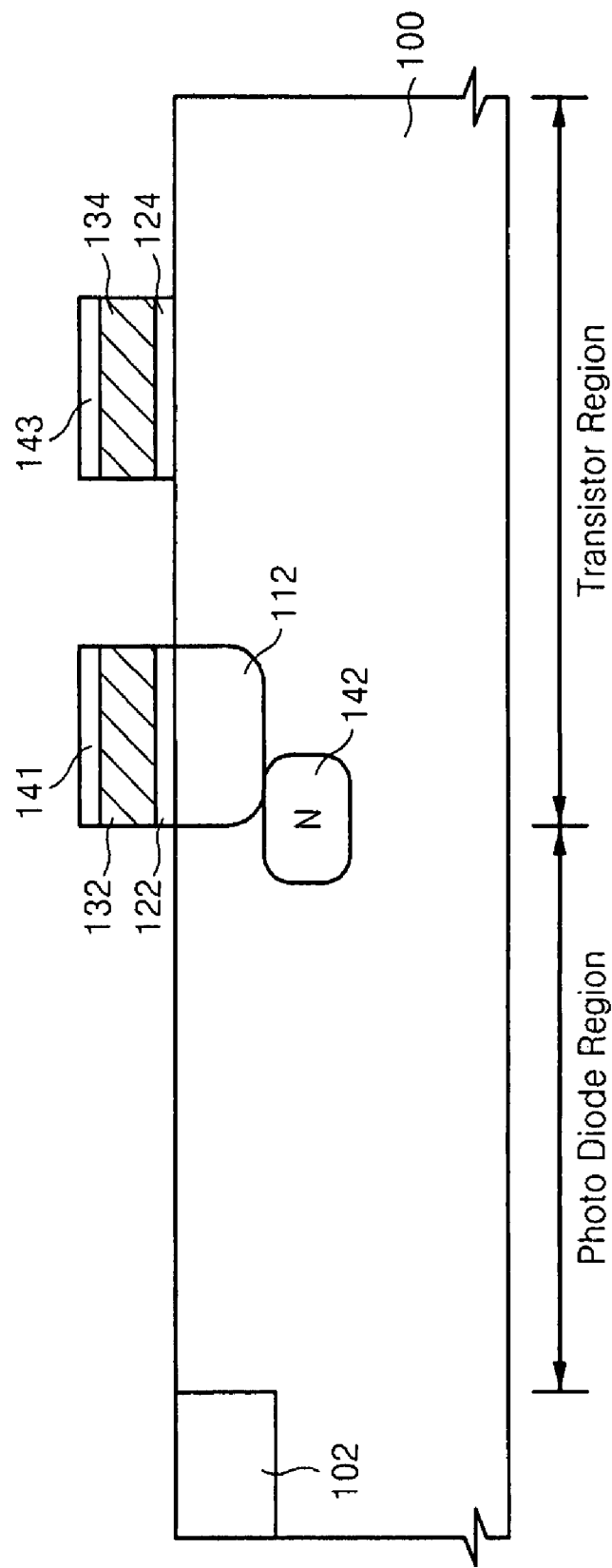

Thereafter referring to FIG. 7, an insulation film (not shown) such as a silicon nitride film for example is formed on the semiconductor substrate 100. In addition, a conductive layer (not shown) such as a poly silicon layer, and a hard mask layer (not shown) such as a silicon oxy-nitride (SiON) layer for example, are formed on the insulation film. Thereafter, such hard mask layer, conductive layer, and insulation film are sequentially patterned over the transistor region of the semiconductor substrate 100 to form the gate dielectric 122, the transfer gate 132, and a hard mask 141 over the channel region 112, and to form a gate dielectric 124, a reset gate 134, and a hard mask 143 for the reset transistor Rx.

In FIGS. 7, 8, 9, and 10, fabrication of the transfer transistor Tx and the reset transistor Rx is illustrated. However, other MOS transistors such as the drive transistor Dx and the select transistor Sx would also be formed in the transistor region of the semiconductor substrate 100.

Figure 8:
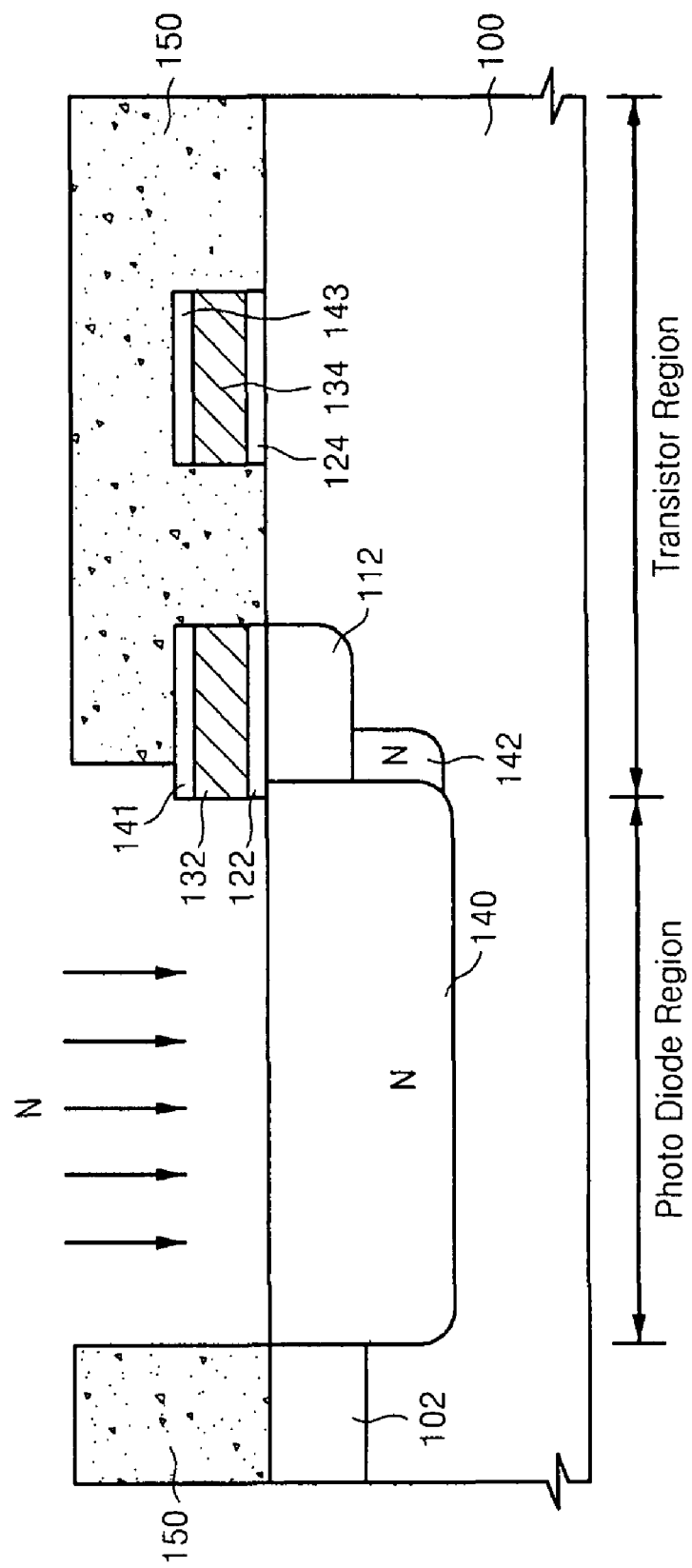

Subsequently referring to FIG. 8, a second implantation mask 150 is patterned to selectively expose the photodiode region of the semiconductor substrate 100 and a part of the hard mask 141 on the transfer gate 132. Thereafter, an N-type dopant is implanted into the exposed photodiode region to form the main photodiode 140. In one embodiment of the present invention, the N-type dopant is implanted substantially perpendicular to the semiconductor substrate 100 for forming the main photodiode 140.

When a photodiode is formed by implantation of a dopant with a tilt angle, ion permeation may occur at a sidewall of the transfer gate not protected by a hard mask. Such ion permeation may cause a tail of N-type impurity ions below the transfer gate in the semiconductor substrate which would increase dark current. For decreasing such dark current, the tail of N-type impurity ions may be compensated for by implanting a P-type dopant into the channel region at a tilt angle slanting toward the photodiode and at a relatively high concentration. However, a swing gap of the transfer transistor may be deteriorated in that case with increased image lag.

Accordingly, the pocket photodiode 142 is formed instead for minimizing image lag. Thus, the N-type dopant for forming the main photodiode 140 is not implanted with a slant angle toward the transfer gate 132 because the pocket photodiode 142 is formed. Accordingly, neither ion permeation at the transfer gate 132 nor a tail of N-type impurity ions below the transfer gate 132 is formed. In addition as a result, the P-type dopant for forming the channel region 112 may be at a relatively low concentration.

Figure 9:
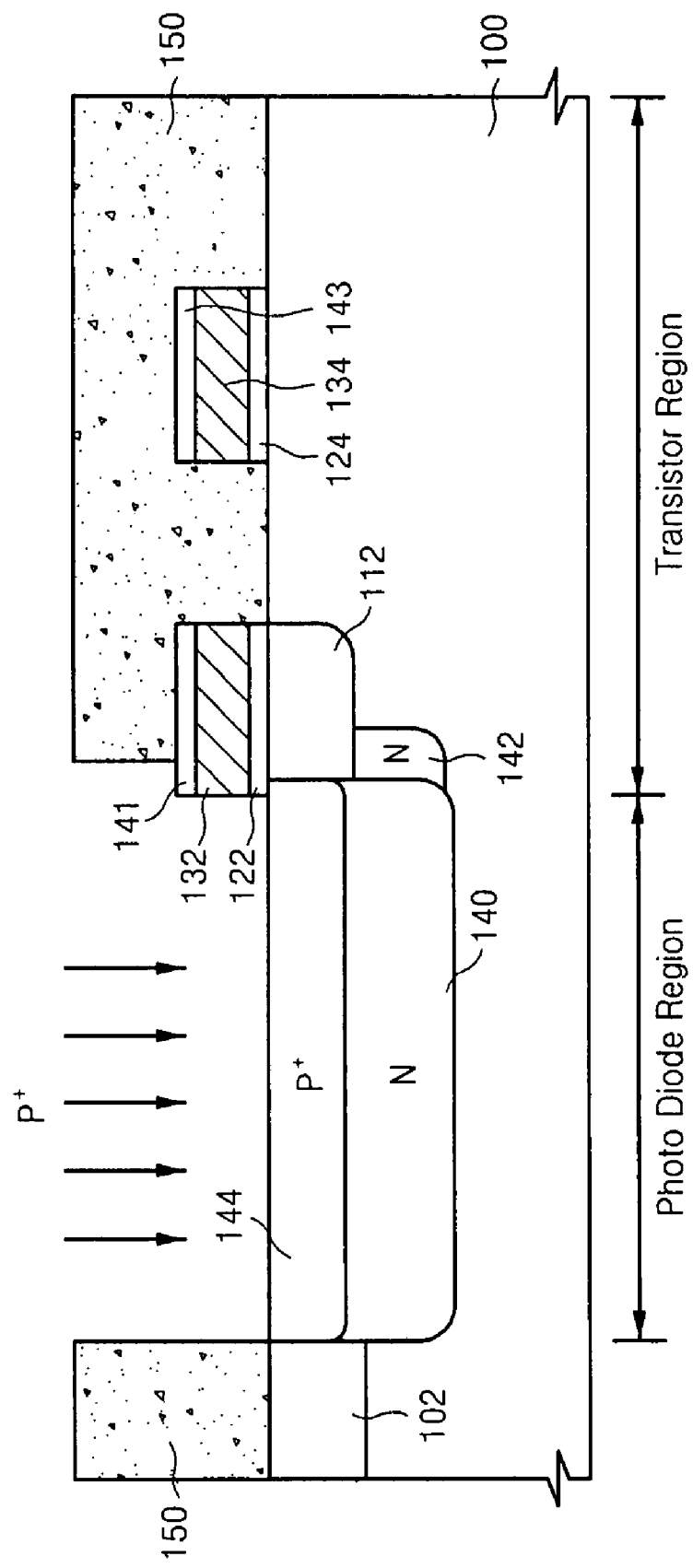

Thereafter referring to FIG. 9, a P-type dopant is implanted to form the P+-type diffusion layer 144 over the main photodiode 140 also using the second implantation mask 150. The diffusion layer 144 is formed at the surface of the semiconductor substrate 100 for reducing dark current in the photodiode region.

Figure 10:
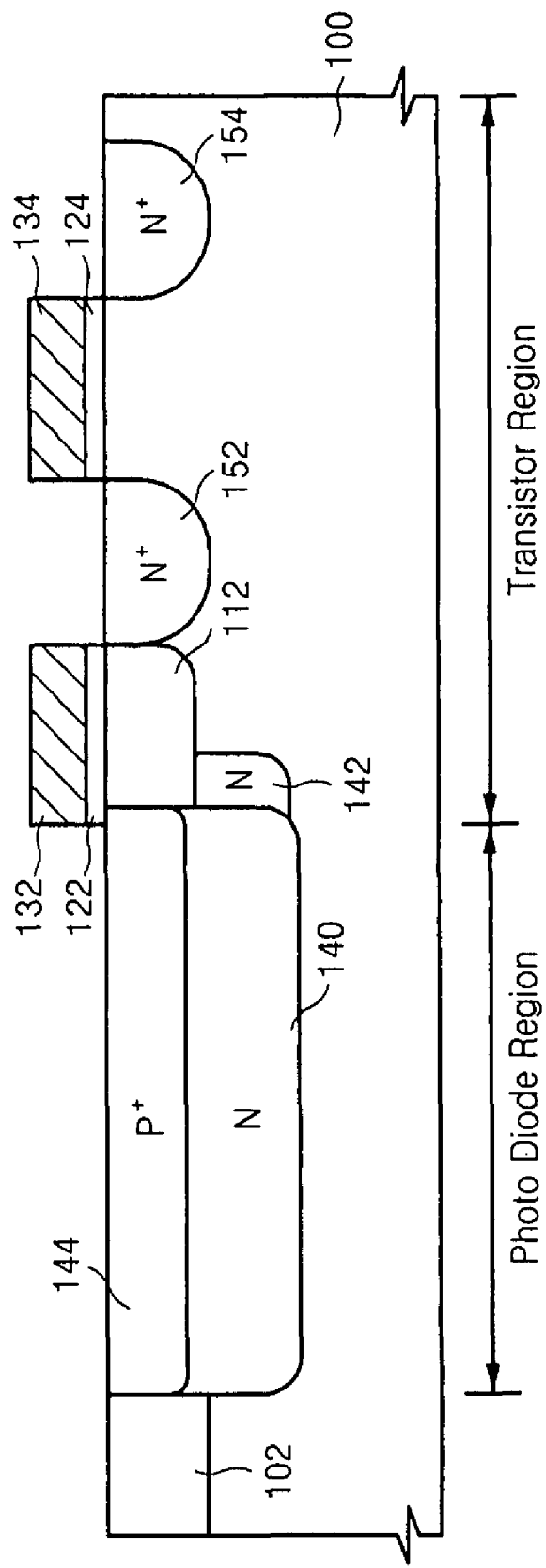

Subsequently referring to FIG. 10, the second implantation mask 150 and the hard masks 141 and 143 of FIG. 9 are removed. Thereafter, an N-type dopant is implanted with a corresponding ion implantation mask to form the N+ floating diffusion region 152 between the transfer gate 132 and the reset gate 134 and to form the drain region 154. The drain region 154 may be formed between the reset gate 134 and a gate (not shown) of the drive transistor Dx. Thereafter, wiring is formed for completing the CMOS image sensor.

In this manner, the pocket photodiode 142 and the channel region 112 are formed with the same implantation mask 110. The pocket photodiode 142 prevents image lag in the CMOS image sensor. In addition, the diffusion layer 144 is formed over the main photodiode 140 for minimizing dark current.

While the present invention has been shown and described with reference to exemplary embodiments thereof, it will be understood by those of ordinary skill in the art that various changes in form and detail may be made herein without departing from the spirit and scope of the present invention, as defined by the following claims.

The present invention is limited only as defined in the following claims and equivalents thereof.

What is claimed is:

1. A method for fabricating an image sensor, the method comprising:
   forming a channel region of a transfer transistor;
   forming a pocket photodiode under a first portion of said channel region by performing a first implantation with a tilt angle to result in a tilted dopant profile of the pocket photodiode;
   forming a photosensitive device in a photo diode region of a semiconductor substrate of a first conductivity type, wherein the photosensitive device includes a main photodiode of a second conductivity type formed with a second implantation that is after and separate from said first implantation;
   wherein the pocket photodiode is of the second conductivity type, and wherein the pocket photodiode and the semiconductor substrate into which the pocket photodiode is implanted are of opposite conductivity types;
   forming a floating diffusion region of the second conductivity type with the channel region being disposed between the photosensitive device and the floating diffusion region; and
   forming a gate dielectric and a transfer gate disposed above the channel region for the transfer transistor;
   wherein the first implantation with the tilt angle for forming the pocket photodiode is performed before formation of the transfer gate.

2. The method of claim 1, wherein a second portion of the bottom surface of the channel region abuts the semiconductor substrate, and wherein the pocket photodiode is not disposed in a whole of said photo diode region having the main photodiode.

3. The method of claim 1, further comprising:
   forming a diffusion layer of the first conductivity type disposed on the main photodiode for minimizing dark current,
   wherein the channel region abuts the main photodiode, the diffusion layer, the pocket photodiode, the floating diffusion region, and the semiconductor substrate.

4. The method of claim 1, wherein the pocket photodiode abuts the first portion of the bottom surface of the channel region, the main photodiode, and the semiconductor substrate.

5. The method of claim 1, further comprising:
   forming a reset transistor having a reset gate dielectric, a reset gate, a drain region, and the floating diffusion region as a source.

6. The method of claim 1, wherein the channel region is of the first conductivity type.

7. The method of claim 1, further comprising:
   forming the channel region as a stack of a plurality of regions with at least one region being of the first conductivity type and with at least one region being of the second conductivity type.

8. The method of claim 1, wherein the first conductivity type is N-type conductivity, and wherein the second conductivity type is P-type conductivity, and wherein the main photodiode is formed with perpendicular implantation of a dopant during the second implantation.

9. The method of claim 1, wherein the image sensor is a CMOS (complementary metal oxide semiconductor) image sensor.

10. A method for fabricating an image sensor, the method comprising:

forming a channel region of a transfer transistor;

minimizing image lag by forming a pocket photodiode under just a partial portion of said channel region by performing a first implantation with a tilt angle to result in a tilted dopant profile of the pocket photodiode;

forming a photosensitive device in a photo diode region of a semiconductor substrate of a first conductivity type, wherein the photosensitive device includes a main photodiode of a second conductivity type formed with a second implantation that is after and separate from said first implantation;

wherein the pocket photodiode is of the second conductivity type, and wherein the pocket photodiode and the semiconductor substrate into which the pocket photodiode is implanted are of opposite conductivity types;

forming a floating diffusion region of the second conductivity type with the channel region being disposed between the photosensitive device and the floating diffusion region; and forming a gate dielectric and a transfer gate disposed above the channel region for the transfer transistor;

wherein the first implantation with the tilt angle for forming the pocket photodiode is performed before formation of the transfer gate.

11. The method of claim 10, wherein another portion of the bottom surface of the channel region abuts the semiconductor substrate, and wherein the pocket photodiode is not disposed in a whole of said photo diode region having the main photodiode.

12. The method of claim 10, further comprising:

forming a diffusion layer of the first conductivity type disposed on the main photodiode for minimizing dark current, wherein the channel region abuts the main photodiode, the diffusion layer, the pocket photodiode, the floating diffusion region, and the semiconductor substrate.

13. The method of claim 10, wherein the pocket photodiode abuts the partial portion of the bottom surface of the channel region, the main photodiode, and the semiconductor substrate.

14. The method of claim 10, further comprising:

forming a reset transistor having a reset gate dielectric, a reset gate, a drain region, and the floating diffusion region as a source.

15. The method of claim 10, wherein the channel region is of the first conductivity type.

16. The method of claim 10, further comprising:

forming the channel region as a stack of a plurality of regions with at least one region being of the first conductivity type and with at least one region being of the second conductivity type.

17. The method of claim 10, wherein the first conductivity type is N-type conductivity, and wherein the second conductivity type is P-type conductivity, and wherein the main photodiode is formed with perpendicular implantation of a dopant during the second implantation.

18. The method of claim 10, wherein the image sensor is a CMOS (complementary metal oxide semiconductor) image sensor.

* * * * *